United States Patent
Chen et al.

(10) Patent No.: US 11,069,630 B2
(45) Date of Patent: Jul. 20, 2021

(54) STRUCTURES AND METHODS FOR REDUCING THERMAL EXPANSION MISMATCH DURING INTEGRATED CIRCUIT PACKAGING

(71) Applicant: TAIWAN SEMICONDUCTOR MANUFACTURING CO., LTD., Hsin-Chu (TW)

(72) Inventors: Kuen-Shian Chen, Hsin-Chu (TW); Chien-Li Kuo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 31 days.

(21) Appl. No.: 16/562,801

(22) Filed: Sep. 6, 2019

(65) Prior Publication Data
US 2020/0098707 A1 Mar. 26, 2020

Related U.S. Application Data

(60) Provisional application No. 62/734,418, filed on Sep. 21, 2018.

(51) Int. Cl.
*H01L 23/58* (2006.01)
*H01L 23/532* (2006.01)
(Continued)

(52) U.S. Cl.
CPC ...... *H01L 23/585* (2013.01); *H01L 21/76895* (2013.01); *H01L 23/528* (2013.01);
(Continued)

(58) Field of Classification Search
CPC ............. H01L 23/585; H01L 23/53295; H01L 23/5226; H01L 23/53214; H01L 23/53228;
(Continued)

(56) References Cited

U.S. PATENT DOCUMENTS 9,502,343 B1 * 11/2016 Hsieh ................ H01L 23/49838
2006/0118960 A1 6/2006 Landis
(Continued)

OTHER PUBLICATIONS

"Coefficient of Linear Thermal Expansion on Polymers Explained"; website: https://passive-components.eu/coefficient-of-linear-thermal-expansion-on-polymers-explained; 2019 (Year: 2019).*
(Continued)

*Primary Examiner* — Syed I Gheyas
(74) *Attorney, Agent, or Firm* — Duane Morris LLP

(57) ABSTRACT

Structures and methods for reducing thermal expansion mismatch during chip scale packaging are disclosed. In one example, a semiconductor structure is disclosed. The semiconductor structure includes a first metal layer over a substrate, a dielectric region, and a polymer region. The first metal layer comprises a first device metal structure. The dielectric region is formed over the first metal layer. The polymer region is formed over the dielectric region. The dielectric region comprises a plurality of metal layers and an inter-metal dielectric layer comprising dielectric material between each pair of two adjacent metal layers in the plurality of metal layers. Each of the plurality of metal layers comprises a dummy metal structure over the first device metal structure. The dummy metal structures in each pair of two adjacent metal layers in the plurality of metal layers shield respectively two non-overlapping portions of the first device metal structure from a top view of the semiconductor structure.

18 Claims, 6 Drawing Sheets

(51) Int. Cl.
  *H01L 23/522* (2006.01)
  *H01L 23/00* (2006.01)
  *H01L 21/768* (2006.01)
  *H01L 23/528* (2006.01)
  *H01L 23/31* (2006.01)
(52) U.S. Cl.
  CPC .... *H01L 23/5226* (2013.01); *H01L 23/53214* (2013.01); *H01L 23/53228* (2013.01); *H01L 23/53242* (2013.01); *H01L 23/53295* (2013.01); *H01L 24/03* (2013.01); *H01L 24/05* (2013.01); *H01L 23/3114* (2013.01); *H01L 24/13* (2013.01); *H01L 2224/0231* (2013.01); *H01L 2224/02373* (2013.01); *H01L 2224/0401* (2013.01); *H01L 2224/05569* (2013.01); *H01L 2224/13023* (2013.01); *H01L 2924/35121* (2013.01)
(58) Field of Classification Search
  CPC . H01L 23/528; H01L 23/3114; H01L 23/562; H01L 2224/05147; H01L 2224/05139; H01L 2224/05124; H01L 23/485
  See application file for complete search history.

(56) References Cited

U.S. PATENT DOCUMENTS

2011/0248404 A1   10/2011   Chiu et al.
2020/0350246 A1*  11/2020   Lin ..................... H01L 23/5226

OTHER PUBLICATIONS

"List of Thermal Expansion Coefficients (CTE) for Natural and Engineered Materials"; website https://www.msesupplies.com/pages/list-of-thermal-expansion-coefficients-cte-for-natural-and-engineered-materials; 2020 (Year: 2020).*

* cited by examiner

STRUCTURES AND METHODS FOR REDUCING THERMAL EXPANSION MISMATCH DURING INTEGRATED CIRCUIT PACKAGING

CROSS-REFERENCE TO RELATED APPLICATIONS

The present application claims priority benefit of U.S. Provisional Application No. 62/734,418, filed on Sep. 21, 2018, the contents of which are incorporated by reference in its entirety.

BACKGROUND

Semiconductor devices including integrated circuits (ICs) are used in a variety of electronic applications, such as personal computers, cell phones, digital cameras, and other electronic equipment. Driven by the trend towards smaller, lighter, and thinner semiconductor products, smaller package types have been developed. One type of smaller packaging for semiconductor devices is wafer level chip scale packaging (WLCSP), in which an integrated circuit die is packaged in a package that typically includes a redistribution layer (RDL) that is used to fan out wiring for contact pads of the integrated circuit die so that electrical contacts can be made with a larger pitch than contact pads of the die. The resultant package has dielectrics, thin film metals, and solder bumps directly on the surface of the die with no additional packaging. The basic structure of the WLCSP has an active surface with polymer coatings and bumps with bare silicon exposed on the remaining sides and back of the die.

The polymer-based dielectric used in the WLCSP process has a coefficient of thermal expansion (CTE) that is different from that of the IC dielectric. In addition, each of the different materials in the IC, e.g. WLCSP polyimide, metal, IC dielectric, may have a unique CTE. This type of CTE mismatch can cause a large stress, especially when the semiconductor die is subjected to elevated temperatures. The stress caused by the CTE mismatch can result in a crack and delamination defect, e.g. a bubble defect. When a sealing process or a WLCSP process has a temperature higher than or lower than a standard threshold, it will lead to a bigger stress accumulation in the IC. As such, existing semiconductor structures have at least the above-mentioned problems during packaging.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION

Figure 1:
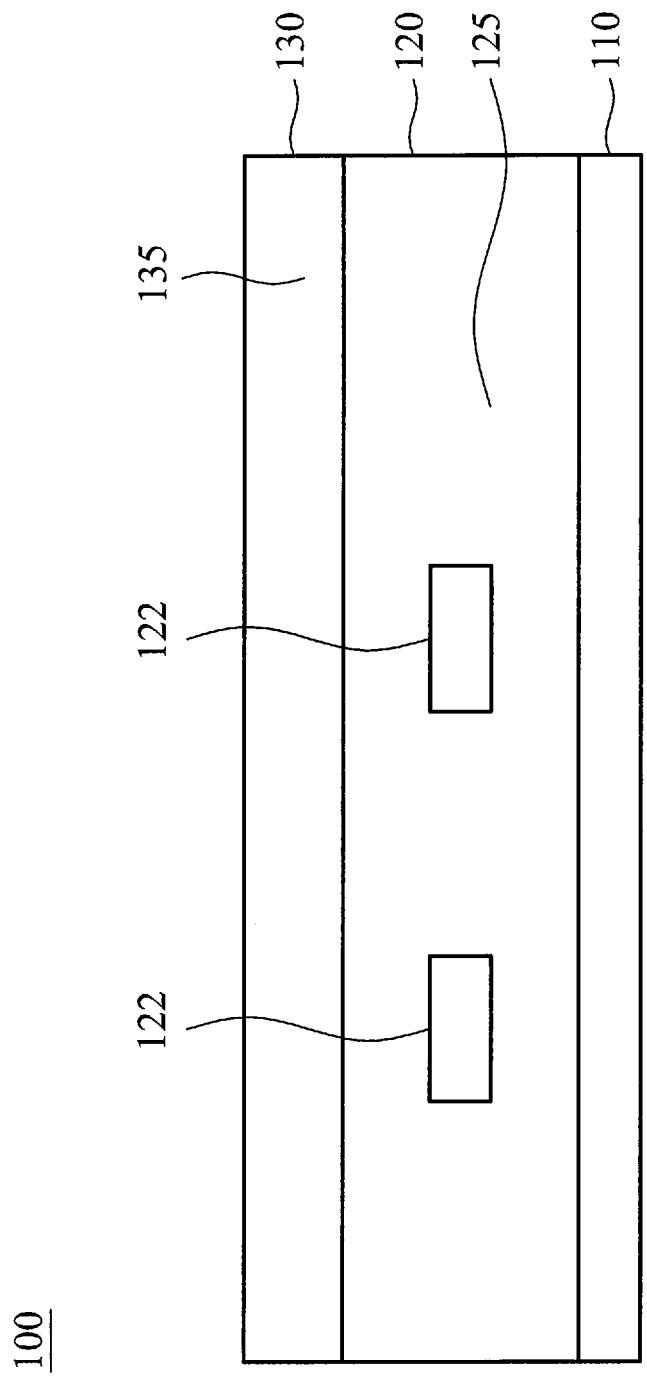
FIG. 1 is a cross-sectional view of an exemplary semiconductor structure, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

To reduce a coefficient of thermal expansion (CTE) mismatch of different materials in a semiconductor device, e.g. an integrated circuit (IC), during a packaging process, the present teaching provides various embodiments of semiconductor structures that have dummy metal structures embedded therein. For example, a metal interconnect material, e.g. aluminum or copper, has a CTE in the range of 15~25 ppm/°

C., which is between the CTE (20~80 ppm/° C.) of WLCSP polymer material, e.g. polyimide, and the CTE (~1 ppm/° C.) of IC dielectric material. As such, the present teaching discloses adding dummy metal structures in either IC dielectric region or package redistribution layer (RDL) to alleviate stress accumulation incurred by CTE mismatch between different materials in the device, thereby eliminating bubble defect or other reliability defects during IC packaging. In one embodiment, after inserting the dummy metal structures in both the IC dielectric region and the RDL region, the CTE of the IC dielectric region is increased to as high as 10~15 ppm/° C. and the CTE of the RDL region is decreased to as low as 20~25 ppm/° C., thereby minimizing the CTE mismatch between the two regions. In contrast to a device node which can help to fulfil a function of the device according to a design rule of the semiconductor device, a dummy structure is not required by the design rule but can be added in the semiconductor device for a certain purpose. Here, embedding dummy metal structures can increase density and uniformity of the IC top metal layers and/or the WLCSP RDL pattern to reduce the stress caused by CTE mismatch.

In some embodiments of the present teaching, dummy metal structures are added in IC dielectric region and/or RDL in a manner to ensure that top and bottom dummy metal structures correspond to non-overlapping positions with respect to a top view of the semiconductor device to reduce stress accumulation to eliminate bubble defect. For example, a semiconductor structure comprises a first metal layer, a dielectric region over the first metal layer, and a polymer region over the dielectric region. The dielectric region comprises a plurality of metal layers each of which comprises a dummy metal structure and a device metal structure. The dummy metal structures in each pair of two adjacent metal layers in the plurality of metal layers shield respectively two non-overlapping portions of the first metal layer from the polymer region along a direction orthogonal to a bottom surface of the polymer region, i.e. from the top view of the semiconductor device. Embedding of the dummy metal structures increases an average CTE of the dielectric region. This non-overlapping type of embedding further reduces stress accumulation caused by CTE mismatch to eliminate bubble defect in the semiconductor device.

In addition, the polymer region comprises an RDL comprising a dummy metal RDL structure and a device metal RDL structure, and an under bump metallization (UBM) formed over the RDL. Embedding of the dummy metal RDL structure decreases an average CTE of the polymer region. The device metal RDL structure is connected to the device metal structure in a top metal layer of the plurality of metal layers. The dummy metal structure in the top metal layer and the dummy metal RDL structure shield respectively two non-overlapping portions of the first metal layer from the polymer region. In one embodiment, the dielectric region comprises fluorine ions. Embedding of the dummy metal structures decreases a density of the fluorine ions in the dielectric region, thereby reducing the stress in the semiconductor device as well.

The disclosed method of adding dummy metal structures can eliminate delamination defect even when the sealing process or the WLCSP process shifts to a worse condition. For example, although the temperature during the packaging process may be elevated above a predetermined threshold, the added dummy metal structures will prevent a crack or delamination defect from occurring by reducing the stress accumulation caused by CTE mismatch.

FIG. 1 is a cross-sectional view of an exemplary semiconductor structure 100, in accordance with some embodiments of the present disclosure. In accordance with one embodiment, the semiconductor structure 100 may be a top portion of an integrated circuit with a chip scale packaging. As shown in FIG. 1, the semiconductor structure 100 includes a first metal layer 110, a dielectric region 120, and a polymer region 130. In one example, the first metal layer 110 is over a substrate (not shown). The first metal layer 110 may comprise at least one of: copper, aluminum, silver. There may be one or more other layers between the first metal layer 110 and the substrate. In various embodiments, dummy metal structures insertion may be applied in any other portion of an IC for CTE mismatch reduction.

In this example, the dielectric region 120 is formed over the first metal layer 110. The dielectric region 120 comprises dielectric material 125 and is embedded with at least one dummy metal structure 122. In one embodiment, the at least one dummy metal structure comprises at least one of: copper, aluminum, silver. The dummy metal structures 122 in this example do not fulfill any function of the integrated circuit. However, embedding of the dummy metal structures 122 increases an average CTE of the dielectric region 120, because the dummy metal structures 122 have a higher CTE than that of the dielectric material 125.

In this example, the polymer region 130 is formed over the dielectric region 120. The polymer region 130 may be formed during a packaging process, e.g. a WLCSP process, of the IC. The polymer region 130 comprises polymer material 135, e.g. polyimide. The polymer region 130 has a CTE higher than that of the dielectric material 125 and higher than that of the dummy metal structures 122. For example, the polymer material 135 is a polyimide with a CTE of 20~80 ppm/° C.; the dielectric material 125 has a CTE of ~1 ppm/° C.; and the dummy metal structures 122 added in the dielectric region 120 have a CTE of 15~25 ppm/° C. As such, embedding of the at least one dummy metal structure 122 in the dielectric region 120 reduces a stress caused by a difference in respective coefficients of thermal expansion of the dielectric region 120 and the polymer region 130. Therefore, a potential crack or delamination defect, e.g. a bubble defect, is avoided.

Figure 2:
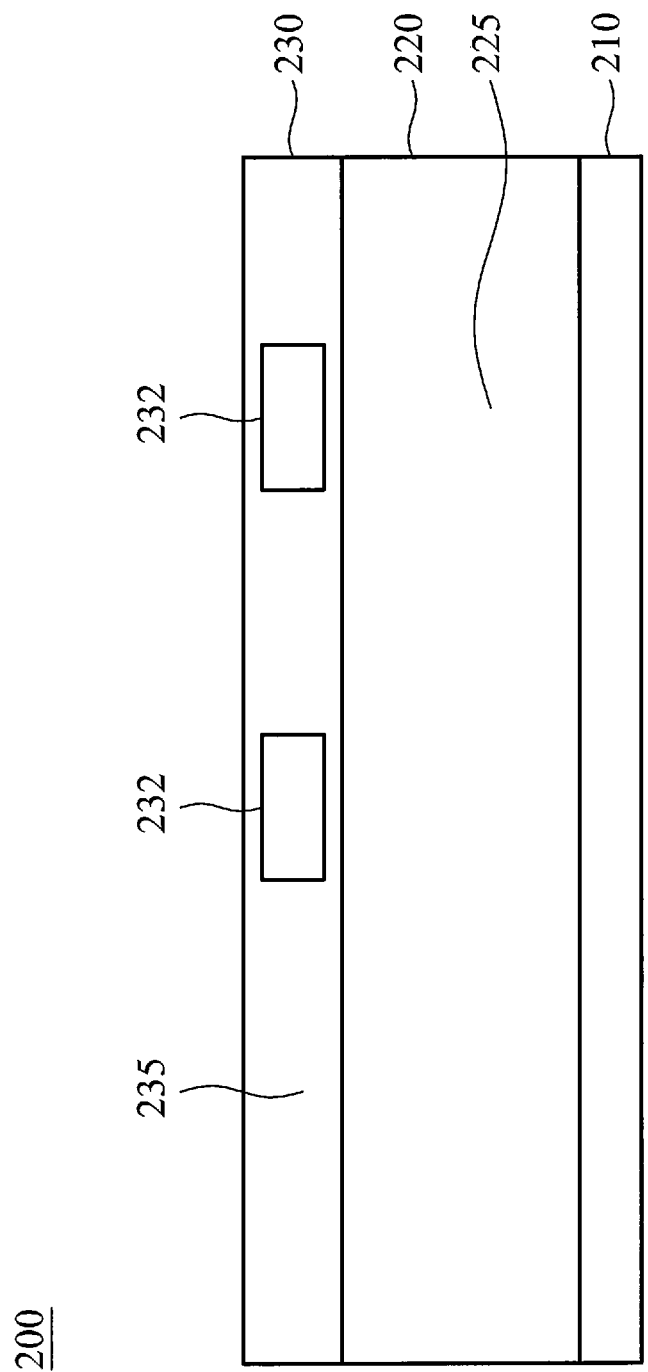
FIG. 2 is a cross-sectional view of another exemplary semiconductor structure, in accordance with some embodiments of the present disclosure.

FIG. 2 is a cross-sectional view of another exemplary semiconductor structure 200, in accordance with some embodiments of the present disclosure. In accordance with one embodiment, the semiconductor structure 200 may be a top portion of an integrated circuit with a chip scale packaging. As shown in FIG. 2, the semiconductor structure 200 includes a first metal layer 210, a dielectric region 220, and a polymer region 230. In one example, the first metal layer 210 is over a substrate (not shown). The first metal layer 210 may comprise at least one of: copper, aluminum, silver. There may be one or more other layers between the first metal layer 210 and the substrate. In alternative embodiments, dummy metal structures insertion may be applied in any other portion of an IC for CTE mismatch reduction.

In this example, the dielectric region 220 is formed over the first metal layer 210. The dielectric region 220 comprises dielectric material 225. The dielectric material 225 has a lower CTE than that of the metal in the first metal layer 210.

In this example, the polymer region 230 is formed over the dielectric region 220. The polymer region 230 may be formed during a packaging process, e.g. a WLCSP process, of the IC, by a depositing method like spin coating. The polymer region 230 comprises polymer material 235, e.g. polyimide, and comprises at least one dummy metal structure 232. In one embodiment, the at least one dummy metal structure 232 comprises at least one of: copper, aluminum, silver. The dummy metal structures 232 in this example do not fulfill any function of the integrated circuit. But embedding of the dummy metal structures 232 decreases an average CTE of the polymer region 230, because the dummy metal structures 232 have a lower CTE than that of the polymer material 235. In one embodiment, the polymer material 235 has a CTE higher than that of the dielectric material 225 and higher than that of the dummy metal structures 232. For example, the polymer material 235 is a polyimide with a CTE of 20~80 ppm/° C.; the dielectric material 225 has a CTE of ~1 ppm/° C.; and the dummy metal structures 232 added in the polymer region 230 have a CTE of 15~25 ppm/° C. As such, embedding of the at least one dummy metal structure 232 in the polymer region 230 reduces a stress caused by a difference in respective CTEs of the dielectric region 220 and the polymer region 230. Therefore, a potential crack or delamination defect, e.g. a bubble defect, is avoided. In another embodiment, both the dielectric region 220 and the polymer region 230 may be added with dummy metal structures to reduce the CTE mismatch in the semiconductor structure 200.

Figure 3:
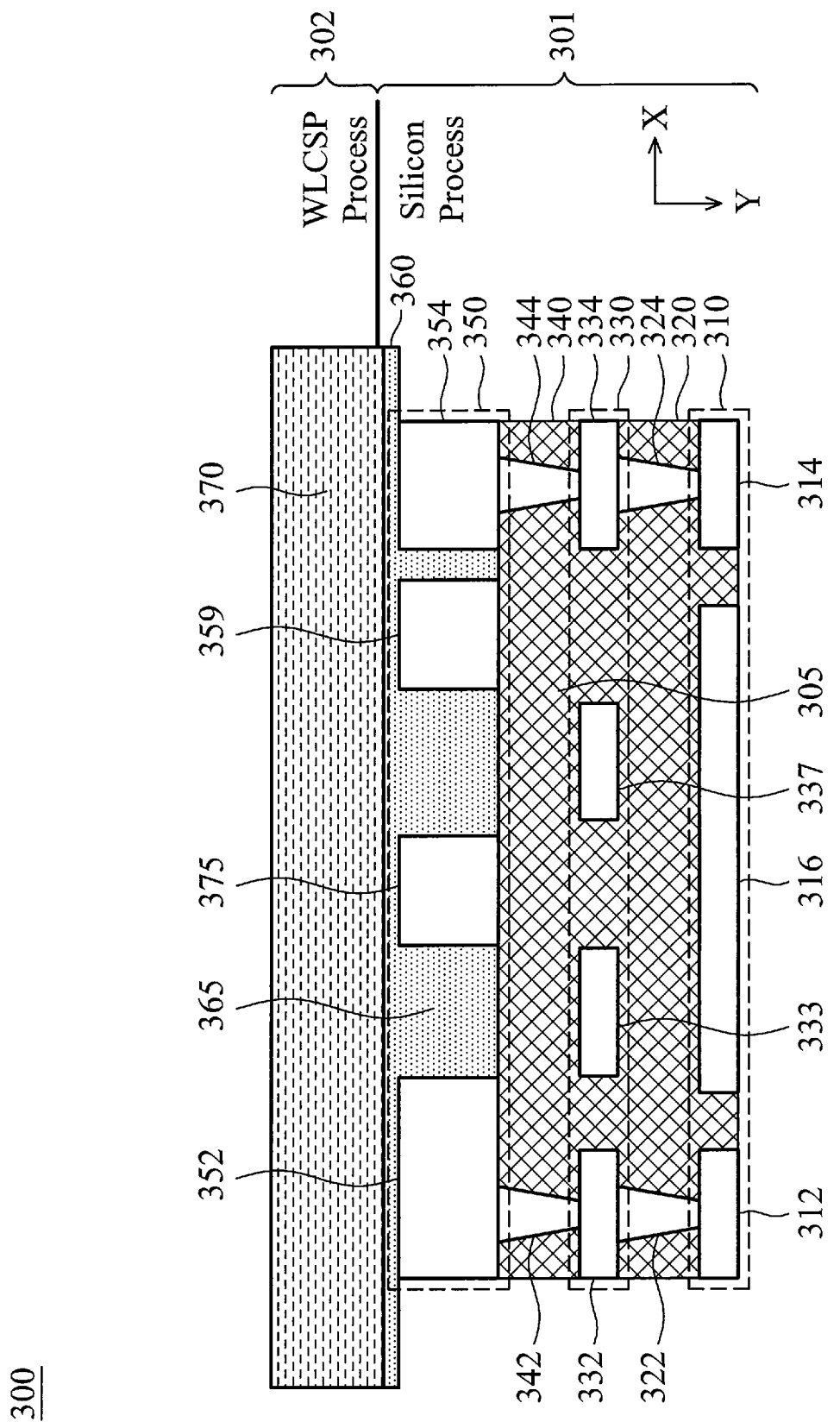
FIG. 3 a cross-sectional view of an exemplary semiconductor structure with a chip scale packaging, in accordance with some embodiments of the present disclosure.

FIG. 3 a cross-sectional view of an exemplary semiconductor structure 300 with a chip scale packaging, in accordance with some embodiments of the present disclosure. In accordance with one embodiment, the semiconductor structure 300 may be a top portion of an integrated circuit with a chip scale packaging. As shown in FIG. 3, the semiconductor structure 300 comprises a first metal layer 310, a second metal layer 330, a third metal layer 350, a sealing layer 360, and a polymer region 370. The first metal layer 310 in this example comprises a first device metal structure 312, a second device metal structure 314, and a middle device metal structure 316. Each of these device metal structures may comprise at least one of: copper, aluminum, silver, and can help to fulfill a function of the integrated circuit. In one example, the first metal layer 310 is over a substrate (not shown). There may be one or more other layers between the first metal layer 310 and the substrate. In various embodiments, dummy metal structures insertion may be applied in any other portion of an IC for CTE mismatch reduction.

In this example, the second metal layer 330 is formed over the first metal layer 310. The second metal layer 330 in this example comprises a first device metal structure 332 formed over the first device metal structure 312, a second device metal structure 334 formed over the second device metal structure 314, and two dummy metal structures 333, 337 formed over the middle device metal structure 316. Each of these device and dummy metal structures in the second metal layer 330 may comprise at least one of: copper, aluminum, silver. None of the two dummy metal structures 333, 337 helps to fulfill a function of the integrated circuit.

In accordance with various embodiments, the device metal structures 332, 334 have shapes and sizes determined based on customer design requirement following technology design rules. In contrast, the dummy metal structures 333, 337 may have different shapes (e.g. rectangle, square) and different sizes (e.g. 3*3 um, 1*1 urn and 0.6*0.6 urn), regardless of the customer design requirement. As such, the shapes and sizes of the dummy metal structures 333, 337 may be same as or different from the shapes and sizes of the device metal structures 332, 334. In addition, different dummy metal structures in different layers may also have same or different dimensions.

The semiconductor structure 300 further comprises a first inter-metal dielectric layer 320 between the first metal layer 310 and the second metal layer 330. The first inter-metal dielectric layer 320 in this example comprises dielectric material 305, a first via 322 connecting the first device metal structure 312 and the first device metal structure 332, and a second via 324 connecting the second device metal structure 314 and the second device metal structure 334. The dielectric material 305 may include a fluorosilicate glass (FSG) layer that includes two sublayers. A first sublayer is an FSG deposited via High-Density Plasma Chemical Vapor Deposition (HDP-CVD); while a second sublayer is an FSG deposited via Plasma-Enhanced Chemical Vapor Deposition (PECVD) on top of the first sublayer.

The dielectric material 305 in this example has a CTE lower than that of the dummy metal structures 333, 337, and lower than that of the polymer region 370.

The third metal layer 350 in this example is formed over the second metal layer 330. The third metal layer 350 in this example comprises a first device metal structure 352 formed over the first device metal structure 332, a second device metal structure 354 formed over the second device metal structure 334, and two dummy metal structures 355, 359 formed over the middle device metal structure 316. Each of these device and dummy metal structures in the third metal layer 350 may comprise at least one of: copper, aluminum, silver. None of the two dummy metal structures 355, 359 helps to fulfill a function of the integrated circuit.

The semiconductor structure 300 further comprises a second inter-metal dielectric layer 340 between the second metal layer 330 and the third metal layer 350. The second inter-metal dielectric layer 340 in this example comprises the dielectric material 305, a first via 342 connecting the first device metal structure 332 and the first device metal structure 352, and a second via 344 connecting the second device metal structure 334 and the second device metal structure 354.

The sealing layer 360 in this example is formed over the third metal layer 350. The sealing layer 360 comprises oxide material 365, e.g. a passivation oxide material. In one embodiment, the sealing layer 360 includes a silicon oxide layer deposited via PECVD and a nitride layer deposited via PECVD on top of the silicon oxide layer. The oxide material 365 in this example has a CTE lower than that of the dummy metal structures 355, 359, and lower than that of the polymer region 370.

The polymer region 370 in this example is formed over the sealing layer 360 during a packaging process, e.g. a WLCSP process, of the IC; while the other layers 310~360 below the polymer region 370 are formed during a silicon process of the IC. The polymer region 370 may be referred to as a packaging portion 302 of the IC; while the other layers 310~360 below the polymer region 370 may be referred to together as a silicon portion 301 of the IC. The polymer region 370 in this example comprises a polymer material 375, e.g. a polyimide. The polymer material 375 has a CTE higher than that of the dielectric material 305, that of the oxide material 365, and higher than that of the dummy metal structures 333, 337, 355, 359. For example, the polymer material 375 is a polyimide with a CTE of 20~80 ppm/° C.; each of the dielectric material 305 and the oxide material 365 has a CTE of ~1 ppm/° C.; and each of the dummy metal structures 333, 337, 355, 359 has a CTE of 15~25 ppm/° C.

As shown in FIG. 3, the metal nodes in the first metal layer 310 and the second metal layer 330 are separated by the dielectric material 305. As such, the two dummy metal structures 333, 337 are embedded in the dielectric material 305. Therefore, embedding of the dummy metal structures 333, 337 increases an average CTE of the silicon portion 301, because the dummy metal structures 333, 337 have a CTE higher than that of the dielectric material 305 and higher than that of the oxide material 365. In addition, the metal nodes in the third metal layer 350 are separated by the oxide material 365, such that the two dummy metal structures 355, 359 are embedded in the oxide material 365. Therefore, embedding of the dummy metal structures 355, 359 increases an average CTE of the silicon portion 301, because the dummy metal structures 355, 359 have a CTE higher than that of the dielectric material 305 and higher than that of the oxide material 365. In this manner, embedding of the dummy metal structures 333, 337, 355, 359 in the silicon portion 301 reduces a stress caused by a difference in respective CTEs of the silicon portion 301 and the polymer region 370. Therefore, a potential crack or delamination defect, e.g. a bubble defect, in the silicon portion 301 due to the stress accumulation may be avoided.

As shown in FIG. 3, each of dummy metal structures 333, 337, 355, 359 shields a corresponding portion of the middle device metal structure 316 from the polymer region 370 along a direction, i.e. direction Y in FIG. 3. The direction Y is orthogonal to a bottom surface of the polymer region 370, or orthogonal to a main plane of the semiconductor structure 300. In addition, the two dummy metal structures 333, 337 in the second metal layer 330 and the two dummy metal structures 355, 359 in the third metal layer 350 shield respectively different and non-overlapping portions of the middle device metal structure 316 from the polymer region 370 along the direction Y. This non-overlapping type of dummy metal embedding can further reduce the stress accumulation caused by CTE mismatch in the semiconductor structure 300, thereby eliminating bubble defect in the IC.

In one embodiment, after the dummy metal insertion, each of the opening areas within the silicon portion 301, e.g. the opening area between the two dummy metal structures 333, 337 in the second metal layer 330, the opening area between the two dummy metal structures 355, 359 in the third metal layer 350, is smaller than a predetermined area, e.g. a 150*150 um$^2$. That is, there is no opening area capable of holding a square of 150*150 um$^2$, after the dummy metal insertions.

Figure 4:
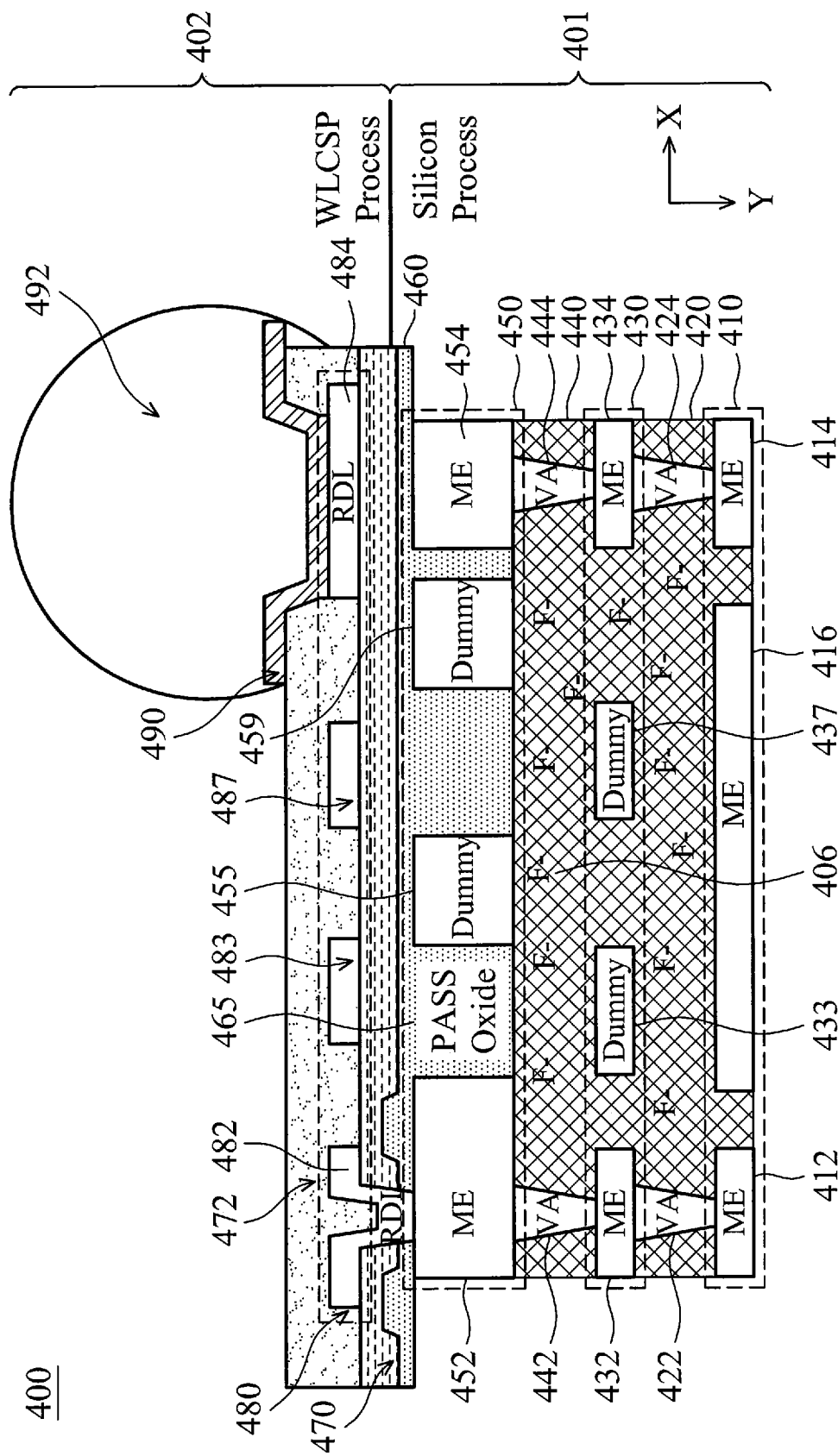
FIG. 4 a cross-sectional view of another exemplary semiconductor structure with a chip scale packaging, in accordance with some embodiments of the present disclosure.

FIG. 4 a cross-sectional view of another exemplary semiconductor structure 400 with a chip scale packaging, in accordance with some embodiments of the present disclosure. In accordance with one embodiment, the semiconductor structure 400 may be a top portion of an integrated circuit with a chip scale packaging. As shown in FIG. 4, the semiconductor structure 400 comprises a first metal layer 410, a second metal layer 430, a third metal layer 450, a sealing layer 460, a first polymer layer 470, a redistribution layer 480, and a second polymer layer 472.

The first metal layer 410 in this example comprises a first device metal structure 412, a second device metal structure 414, and a middle device metal structure 416. Each of these device metal structures may comprise at least one of: copper, aluminum, silver, and can help to fulfill a function of the integrated circuit. In one example, the first metal layer 410 is over a substrate (not shown). There may be one or more other layers between the first metal layer 410 and the substrate. In various embodiments, dummy metal structures insertion may be applied in any other portion of an IC for CTE mismatch reduction.

In this example, the second metal layer 430 is formed over the first metal layer 410. The second metal layer 430 in this example comprises a first device metal structure 432 formed over the first device metal structure 412, a second device metal structure 434 formed over the second device metal structure 414, and two dummy metal structures 433, 437 formed over the middle device metal structure 416. Each of these device and dummy metal structures in the second metal layer 430 may comprise at least one of: copper, aluminum, silver. None of the two dummy metal structures 433, 437 helps to fulfill a function of the integrated circuit.

The semiconductor structure 400 further comprises a first inter-metal dielectric layer 420 between the first metal layer 410 and the second metal layer 430. The first inter-metal dielectric layer 420 in this example comprises dielectric material 405, a first via 422 connecting the first device metal structure 412 and the first device metal structure 432, and a second via 424 connecting the second device metal structure 414 and the second device metal structure 434. The dielectric material 405 in this example has a CTE lower than that of the dummy metal structures 433, 437, and lower than that of the first polymer layer 470 and the second polymer layer 472.

The third metal layer 450 in this example is formed over the second metal layer 430. The third metal layer 450 in this example comprises a first device metal structure 452 formed over the first device metal structure 432, a second device metal structure 454 formed over the second device metal structure 434, and two dummy metal structures 455, 459 formed over the middle device metal structure 416. Each of these device and dummy metal structures in the third metal layer 450 may comprise at least one of: copper, aluminum, silver. None of the two dummy metal structures 455, 459 helps to fulfill a function of the integrated circuit.

The semiconductor structure 400 further comprises a second inter-metal dielectric layer 440 between the second metal layer 430 and the third metal layer 450. The second inter-metal dielectric layer 440 in this example comprises the dielectric material 405, a first via 442 connecting the first device metal structure 432 and the first device metal structure 452, and a second via 444 connecting the second device metal structure 434 and the second device metal structure 454.

The sealing layer 460 in this example is formed over the third metal layer 450. The sealing layer 460 comprises oxide material 465, e.g. a pass oxide material. The oxide material 465 in this example has a CTE lower than that of the dummy metal structures 455, 459, and lower than that of the first polymer layer 470 and the second polymer layer 472.

The first polymer layer 470 in this example is formed over the sealing layer 460 during a packaging process, e.g. a WLCSP process, of the IC, while the layers 410~460 below the first polymer layer 470 are formed during a silicon process of the IC. The first polymer layer 470 and the layers above the first polymer layer 470 may be referred to together as a packaging portion 402 of the IC, while the layers 410~460 below the first polymer layer 470 may be referred to together as a silicon portion 401 of the IC. The first polymer layer 470 in this example comprises a polymer material, e.g. a polyimide, that has a CTE higher than that of the dielectric material 405, that of the oxide material 465, and that of the dummy metal structures 433, 437, 455, 459. For example, the first polymer layer 470 has a polyimide with a CTE of 20~80 ppm/° C.; each of the dielectric material 405 and the oxide material 465 has a CTE of ~1 ppm/° C.; and each of the dummy metal structures 433, 437, 455, 459 has a CTE of 15~25 ppm/° C.

The redistribution layer 480 in this example is formed over the first polymer layer 470 during a packaging process, e.g. a WLCSP process, of the IC. The redistribution layer 480 comprises a first device metal RDL structure 482 formed over the first device metal structure 452, a second device metal RDL structure 484 formed over the second device metal structure 454, and two dummy metal RDL structures 483, 487 formed over the middle device metal structure 416. Each of these device and dummy metal RDL structures in the redistribution layer 480 may comprise at least one of: copper, aluminum, silver. None of the two dummy metal RDL structures 483, 487 helps to fulfill a function of the integrated circuit. In one embodiment, the first device metal RDL structure 482 is connected to the first device metal structure 452 serving as a contact pad in the top metal layer 450. The second device metal RDL structure 484 may also be connected to the second device metal structure 454 serving as a contact pad in the top metal layer 450.

The second polymer layer 472 in this example is formed over the redistribution layer 480 during a packaging process, e.g. a WLCSP process, of the IC. The second polymer layer 472 in this example comprises a polymer material, e.g. a polyimide, that has a CTE higher than that of the dielectric material 405, that of the oxide material 465, and that of the dummy metal structures 433, 437, 455, 459, 483, 487. The polymer material in the second polymer layer 472 may be the same as or different from the polymer material in the first polymer layer 470. The semiconductor structure 400 in this example further comprises an under bump metallization (UBM) 490 formed over the second polymer layer 472, and a solder bump 492 formed on the UBM 490 during the packaging process.

As shown in FIG. 4, the metal nodes in the first metal layer 410 and the second metal layer 430 are separated by the dielectric material 405. As such, the two dummy metal structures 433, 437 are embedded in the dielectric material 405. Therefore, embedding of the dummy metal structures 433, 437 increases an average CTE of the silicon portion 401, because the dummy metal structures 433, 437 have a CTE higher than that of the dielectric material 405 and higher than that of the oxide material 465. In addition, the metal nodes in the third metal layer 450 are separated by the oxide material 465, such that the two dummy metal structures 455, 459 are embedded in the oxide material 465. Therefore, embedding of the dummy metal structures 455, 459 increases an average CTE of the silicon portion 401, because the dummy metal structures 455, 459 have a CTE higher than that of the dielectric material 405 and higher than that of the oxide material 465. Furthermore, the metal nodes in the redistribution layer 480 are separated by the polymer material in the second polymer layer 472, such that the two dummy metal RDL structures 483, 487 are embedded in the polymer material. Therefore, embedding of the two dummy metal RDL structures 483, 487 decreases an average CTE of the packaging portion 402, because the dummy metal RDL structures 483, 487 have a CTE lower than that of the polymer material in the first polymer layer 470 and the second polymer layer 472.

In this manner, embedding of the dummy metal structures 433, 437, 455, 459 in the silicon portion 401 and embedding of the dummy metal RDL structures 483, 487 in the packaging portion 402 reduce a stress caused by a difference or mismatch in respective CTEs of the silicon portion 401 and the packaging portion 402. Therefore, a potential crack or delamination defect, e.g. a bubble defect, in the silicon portion 401 due to the stress accumulation is avoided.

As shown in FIG. 4, each of dummy metal structures 433, 437, 455, 459, 483, 487 shields a corresponding portion of the middle device metal structure 416 from the second polymer layer 472 along a direction, i.e. direction Y in FIG. 4. The direction Y is orthogonal to a bottom surface of the second polymer layer 472, or orthogonal to a main plane of the semiconductor structure 400. In addition, the two dummy metal structures 433, 437 in the second metal layer 430 and the two dummy metal structures 455, 459 in the third metal layer 450 shield respectively different and non-overlapping portions of the middle device metal structure 416 from the second polymer layer 472 along the direction Y or from a top view of the semiconductor structure 400; the two dummy metal structures 455, 459 in the third metal layer 450 and the two dummy metal RDL structures 483, 487 in the redistribution layer 480 shield respectively different and non-overlapping portions of the middle device metal structure 416 from the second polymer layer 472 along the direction Y or from the top view of the semiconductor structure 400. This non-overlapping type of dummy metal embedding can further reduce the stress accumulation caused by CTE mismatch in the semiconductor structure 400, thereby eliminating bubble defect in the IC. When the dummy metal structures in two metal layers are added in an overlapping manner, a stress along the direction X may be generated to form a crack in the IC.

In one embodiment, the dummy metal structures in two adjacent layers do not overlap, while the dummy metal structures in two non-adjacent layers can overlap. For example, the two dummy metal structures 433, 437 in the second metal layer 430 and the two dummy metal structures 455, 459 in the third metal layer 450 do not overlap; the two dummy metal structures 455, 459 in the third metal layer 450 and the two dummy metal RDL structures 483, 487 in the redistribution layer 480 do not overlap; but the two dummy metal structures 433, 437 in the second metal layer 430 and the two dummy metal RDL structures 483, 487 in the redistribution layer 480 do overlap.

In one embodiment, the semiconductor structure 400 has a plurality of metal layers over the first metal layer 410 and each of the metal layers comprises a dummy metal structure for shielding the middle device metal structure 416 from the second polymer layer 472. In this case, the dummy metal structures in each pair of two adjacent metal layers in the plurality of metal layers shield respectively two non-overlapping portions of the first metal layer 410 from the second polymer layer 472 along the direction Y.

As shown in FIG. 4, the silicon portion 401 in this example comprises fluorine ions 406 in-situ formed therein. In this case, embedding of the dummy metal structures 433, 437, 455, 459 decreases a density of the fluorine ions 406 in the silicon portion 401. This reduces the stress in the semiconductor structure 400 as well. This is because when the fluorine ions 406 have a higher density, they will diffuse more with an elevated temperature during packaging or operation of the semiconductor device, which may cause a stress and a resulting crack in the semiconductor device. That is, a higher concentration of fluorine in the dielectric area 405 causes a higher possibility of bubble defect in the silicon portion 401.

The disclosed methods of adding dummy metal structures can eliminate delamination defect even when the sealing process or the WLCSP process shifts to a worse condition. For example, even if the temperature during the packaging process is higher than or lower than a standard during the silicon process or packaging process, the added dummy metal structures will prevent a crack or delamination defect from occurring by reducing the stress accumulation caused by CTE mismatch in the IC.

Figure 5:
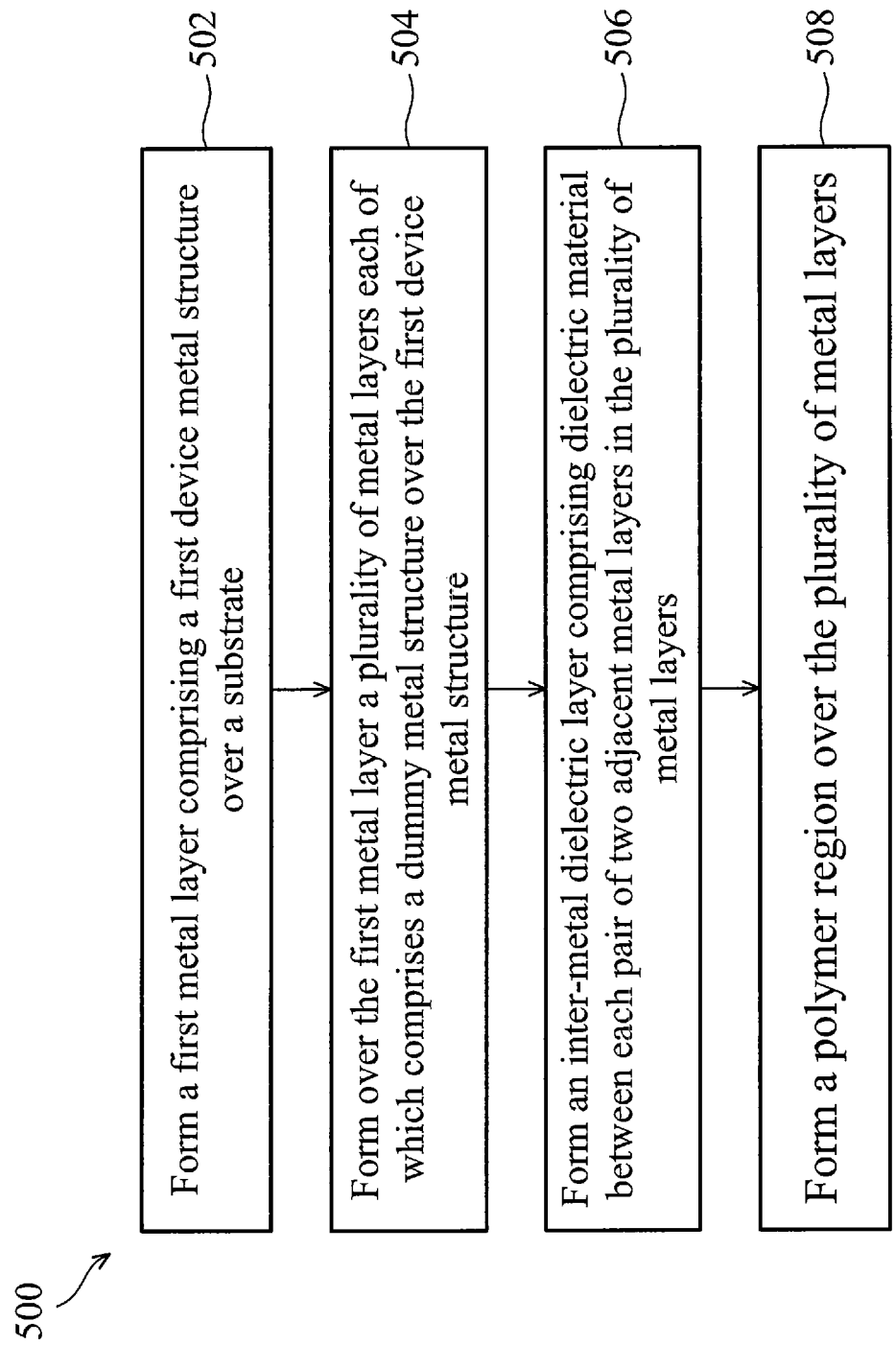
FIG. 5 is a flow chart illustrating an exemplary method for forming a semiconductor structure, in accordance with some embodiments of the present disclosure.

FIG. 5 is a flow chart illustrating an exemplary method 500 for forming a semiconductor structure, in accordance with some embodiments of the present disclosure. At operation 502, a first metal layer comprising a first device metal structure is formed over a substrate. A plurality of metal layers is formed at operation 504 over the first metal layer. Each of the plurality of metal layers comprises a dummy metal structure over the first device metal structure. The dummy metal structures in each pair of two adjacent metal layers in the plurality of metal layers shield respectively two non-overlapping portions of the first device metal structure from a top view of the semiconductor structure. An inter-metal dielectric layer comprising dielectric material is formed at operation 506 between each pair of two adjacent metal layers in the plurality of metal layers. The plurality of metal layers and the inter-metal dielectric layers form a dielectric region. At 508, a polymer region is formed over the plurality of metal layers. The polymer region has a higher CTE than that of the dielectric material. Embedding of the dummy metal structures in the dielectric region reduces the CTE mismatch between the dielectric region and the polymer region. The order of the operations shown in FIG. 5 may be changed according to different embodiments of the present disclosure.

Figure 6:
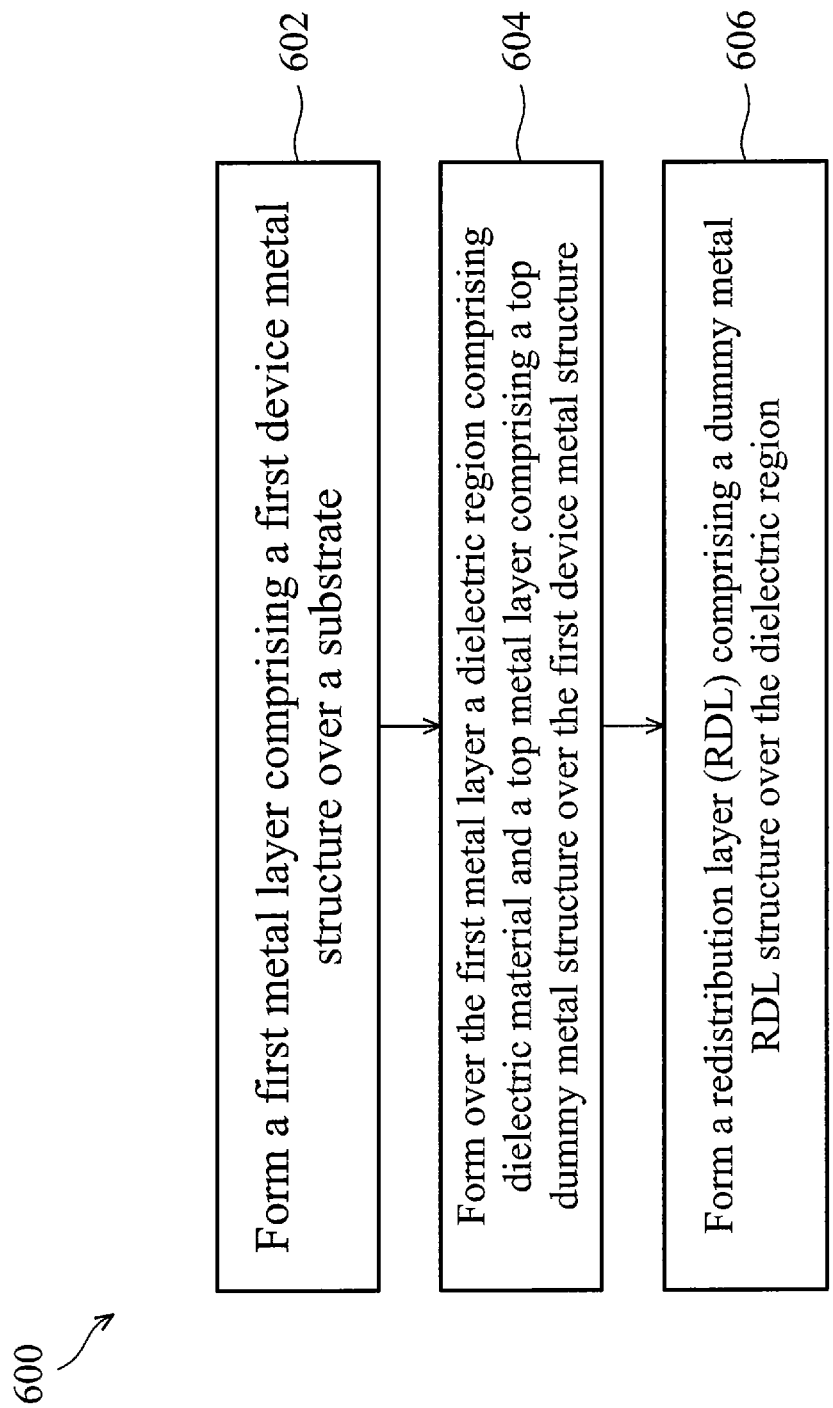
FIG. 6 is a flow chart illustrating another exemplary method for forming a semiconductor structure, in accordance with some embodiments of the present disclosure.

FIG. 6 is a flow chart illustrating another exemplary method 600 for forming a semiconductor structure, in accordance with some embodiments of the present disclosure. At operation 602, a first metal layer comprising a first device metal structure is formed over a substrate. A dielectric region comprising dielectric material and a top metal layer comprising a top dummy metal structure is formed at operation 604 over the first device metal structure. The top dummy metal structure and the dummy metal RDL structure shield respectively two non-overlapping portions of the first device metal structure from a top view of the semiconductor structure. A polymer region comprising a redistribution layer (RDL) comprising a dummy metal RDL structure is formed at operation 606 over the dielectric region. The polymer region comprises polymer material. The polymer material has a higher CTE than that of the dielectric material; while the dummy metal has a CTE between that of the dielectric material and that of the polymer material. The order of the operations shown in FIG. 6 may be changed according to different embodiments of the present disclosure.

In an embodiment of the present teaching, a semiconductor structure is disclosed. The semiconductor structure includes a first metal layer over a substrate, a dielectric region, and a polymer region. The first metal layer comprises a first device metal structure. The dielectric region is formed over the first metal layer. The polymer region is formed over the dielectric region. The dielectric region comprises a plurality of metal layers and an inter-metal dielectric layer comprising dielectric material between each pair of two adjacent metal layers in the plurality of metal layers. Each of the plurality of metal layers comprises a dummy metal structure over the first device metal structure. The dummy metal structures in each pair of two adjacent metal layers in the plurality of metal layers shield respectively two non-overlapping portions of the first device metal structure from a top view of the semiconductor structure.

In another embodiment of the present teaching, a semiconductor structure is disclosed. The semiconductor structure includes a first metal layer over a substrate, a dielectric region, and a polymer region. The first metal layer comprises a first device metal structure. The dielectric region is formed over the first metal layer. The polymer region is formed over the dielectric region. The dielectric region comprises dielectric material and a top metal layer comprising a top dummy metal structure over the first device metal structure. The polymer region comprises polymer material and a redistribution layer (RDL) comprising a dummy metal RDL structure. The top dummy metal structure and the dummy metal RDL structure shield respectively two non-overlapping portions of the first device metal structure from a top view of the semiconductor structure.

In yet another embodiment of the present teaching, a method for manufacturing a semiconductor structure is disclosed. A first metal layer comprising a first device metal structure is formed over a substrate. A dielectric region is formed over the first metal layer. The dielectric region comprises a plurality of metal layers and an inter-metal dielectric layer comprising dielectric material between each pair of two adjacent metal layers in the plurality of metal layers. Each of the plurality of metal layers comprises a dummy metal structure over the first device metal structure. The dummy metal structures in each pair of two adjacent metal layers in the plurality of metal layers shield respectively two non-overlapping portions of the first device metal structure from a top view of the semiconductor structure. A polymer region is formed over the dielectric region.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a first metal layer comprising a first device metal structure over a substrate;
 a dielectric region formed over the first metal layer, wherein the dielectric region comprises:
  a plurality of metal layers each of which comprises a dummy metal structure over the first device metal structure, wherein the dummy metal structures in each pair of two adjacent metal layers in the plurality of metal layers shield respectively two non-overlapping portions of the first device metal structure from a top view of the semiconductor structure, and
  an inter-metal dielectric layer comprising dielectric material between each pair of two adjacent metal layers in the plurality of metal layers; and
 a polymer region formed over the dielectric region, wherein:
  the dielectric region comprises fluorine ions, and
  embedding of the dummy metal structures decreases a density of the fluorine ions in the dielectric region.

2. The semiconductor structure of claim 1, wherein:
 the polymer region has a higher coefficient of thermal expansion than that of the dielectric material; and
 the dummy metal structures in the dielectric region increases an average coefficient of thermal expansion of the dielectric region.

3. The semiconductor structure of claim 1, wherein the plurality of metal layers comprises:
 a second metal layer comprising a second dummy metal structure;
 a third metal layer comprising a third dummy metal structure over the second metal layer, wherein the second and third dummy metal structures shield respectively two non-overlapping portions of the first device metal structure from the top view of the semiconductor structure; and
a fourth metal layer comprising a fourth dummy metal structure over the third metal layer, wherein the third and fourth dummy metal structures shield respectively two non-overlapping portions of the first device metal structure from the top view of the semiconductor structure, and wherein the second and fourth dummy metal structures shield respectively two overlapping portions of the first device metal structure from the top view of the semiconductor structure.

4. The semiconductor structure of claim 1, wherein the dielectric region further comprises:
a sealing layer over the plurality of metal layers, wherein the sealing layer comprises oxide material having a lower coefficient of thermal expansion than that of the dummy metal structures.

5. The semiconductor structure of claim 1, wherein:
each of the plurality of metal layers further comprises a device metal structure; and
the inter-metal dielectric layer comprises a via connecting the device metal structures in each pair of two adjacent metal layers.

6. The semiconductor structure of claim 5, wherein:
the dielectric region comprises a first inter-metal dielectric layer between the first metal layer and a bottom metal layer of the plurality of metal layers; and
the first inter-metal dielectric layer comprises a via connecting the first device metal structure in the first metal layer and the device metal structure in the bottom metal layer.

7. The semiconductor structure of claim 1, wherein the polymer region comprises:
a redistribution layer (RDL) comprising a dummy metal RDL structure and a device metal RDL structure, wherein the dummy metal RDL structure decreases an average coefficient of thermal expansion of the polymer region, and wherein the device metal RDL structure is connected to the device metal structure in a top metal layer of the plurality of metal layers; and
an under bump metallization (UBM) formed over the RDL.

8. The semiconductor structure of claim 7, wherein the dummy metal structure in the top metal layer and the dummy metal RDL structure shield respectively two non-overlapping portions of the first device metal structure from the top view of the semiconductor structure.

9. The semiconductor structure of claim 1, wherein:
each of the first device metal structure and the dummy metal structures comprises at least one of: copper, aluminum, silver;
the polymer material comprises polyimide; and
embedding of the dummy metal structures reduces a stress caused by a difference in respective coefficients of thermal expansion of the dielectric region and the polymer region.

10. The semiconductor structure of claim 1, wherein:
each opening area between two adjacent dummy metal structures on each of the plurality of metal layers is smaller than a predetermined threshold.

11. A semiconductor structure, comprising:
a first metal layer comprising a first device metal structure over a substrate;
a dielectric region formed over the first metal layer, wherein the dielectric region comprises dielectric material and a top metal layer comprising a top dummy metal structure over the first device metal structure; and
a polymer region formed over the dielectric region, wherein the polymer region comprises polymer material and a redistribution layer (RDL) comprising a dummy metal RDL structure, wherein the top dummy metal structure and the dummy metal RDL structure shield respectively two non-overlapping portions of the first device metal structure from a top view of the semiconductor structure.

12. The semiconductor structure of claim 11, wherein:
the polymer material has a higher coefficient of thermal expansion than that of the dielectric region; and
the dummy metal RDL structure decreases an average coefficient of thermal expansion of the polymer region.

13. The semiconductor structure of claim 11, wherein the dielectric region comprises:
a plurality of metal layers comprising the top metal layer, wherein each of the plurality of metal layers comprises a dummy metal structure over the first device metal structure, wherein the dummy metal structures in each pair of two adjacent metal layers in the plurality of metal layers shield respectively two non-overlapping portions of the first device metal structure from the top view of the semiconductor structure; and
an inter-metal dielectric layer comprising dielectric material between each pair of two adjacent metal layers in the plurality of metal layers.

14. The semiconductor structure of claim 13, wherein:
each of the plurality of metal layers further comprises a device metal structure; and
the inter-metal dielectric layer comprises a via connecting the device metal structures in each pair of two adjacent metal layers.

15. The semiconductor structure of claim 11, wherein the dielectric region further comprises:
a sealing layer over the top metal layer, wherein the sealing layer comprises oxide material having a lower coefficient of thermal expansion than that of the top dummy metal structure.

16. A method for manufacturing a semiconductor structure, comprising:
forming a first metal layer comprising a first device metal structure over a substrate;
forming a dielectric region over the first metal layer, wherein the dielectric region is formed by:
forming a plurality of metal layers each of which comprises a dummy metal structure over the first device metal structure, wherein the dummy metal structures in each pair of two adjacent metal layers in the plurality of metal layers shield respectively two non-overlapping portions of the first device metal structure from a top view of the semiconductor structure, and
forming an inter-metal dielectric layer comprising dielectric material between each pair of two adjacent metal layers in the plurality of metal layers; and
forming a polymer region over the dielectric region, wherein:
each of the first device metal structure and the dummy metal structures comprises at least one of: copper, aluminum, or silver,
the polymer material comprises polyimide, and
embedding of the dummy metal structures reduces a stress caused by a difference in respective coefficients of thermal expansion of the dielectric region and the polymer region.

17. The method of claim 16, wherein:
- the polymer region has a higher coefficient of thermal expansion than that of the dielectric material; and
- embedding of the dummy metal structures increases an average coefficient of thermal expansion of the dielectric region.

18. The method of claim 16, wherein forming the polymer region comprises:
- forming a redistribution layer (RDL) comprising a dummy metal RDL structure and a device metal RDL structure, wherein the dummy metal RDL structure decreases an average coefficient of thermal expansion of the polymer region, and wherein the device metal RDL structure is connected to the device metal structure in a top metal layer of the plurality of metal layers; and
- forming an under bump metallization (UBM) over the RDL.

* * * * *